US007991437B2

(12) United States Patent
Camuffo et al.

(10) Patent No.: US 7,991,437 B2
(45) Date of Patent: Aug. 2, 2011

(54) METHOD AND APPARATUS FOR CONTROLLING OUTPUT POWER IN POWER AMPLIFIERS

(75) Inventors: Andrea Camuffo, München (DE);
Andreas Langer, Unterschleissheim-Lohhof (DE)

(73) Assignee: Infineon Technologies AG, Neubiberg (DE)

( * ) Notice: Subject to any disclaimer, the term of this patent is extended or adjusted under 35 U.S.C. 154(b) by 994 days.

(21) Appl. No.: 11/763,589

(22) Filed: Jun. 15, 2007

(65) Prior Publication Data
US 2008/0102758 A1    May 1, 2008

Related U.S. Application Data

(60) Provisional application No. 60/863,496, filed on Oct. 30, 2006.

(51) Int. Cl.
*H04B 1/38* (2006.01)
(52) U.S. Cl. ............... 455/574; 455/67.11; 455/341; 455/343.1; 455/67.14; 455/127.1; 455/127.3; 455/127.5; 455/226.1; 330/289; 330/298; 361/694; 361/695; 361/688; 361/696; 361/697; 320/128; 320/136; 320/134; 320/135; 320/127
(58) Field of Classification Search ............ 455/73, 455/67.11, 115, 117, 127, 95, 8–9, 38.3, 455/343, 435, 572–574, 566–567, 403; 330/289, 330/298, 207; 361/694, 695, 688, 696, 697; 320/128, 134–136, 127; 370/216, 222
See application file for complete search history.

(56) References Cited

U.S. PATENT DOCUMENTS

| 5,519,886 | A  | * | 5/1996  | Gilbert et al. ............ 455/115.1 |
| 5,870,685 | A  | * | 2/1999  | Flynn ........................... 455/573 |
| 6,087,949 | A  | * | 7/2000  | Yanagida .................... 340/635 |
| 6,169,884 | B1 | * | 1/2001  | Funk ............................ 455/522 |
| 6,427,072 | B1 | * | 7/2002  | Reichelt .................... 455/404.1 |
| 6,477,139 | B1 | * | 11/2002 | Anderson et al. ........... 370/216 |
| 6,574,209 | B1 | * | 6/2003  | Kosaka ........................ 370/342 |
| 6,760,311 | B1 | * | 7/2004  | Raith ........................... 370/252 |
| 6,799,058 | B2 | * | 9/2004  | An ............................... 455/560 |
| 6,920,312 | B1 | * | 7/2005  | Benjamin .................... 455/69 |
| 7,206,567 | B2 | * | 4/2007  | Jin et al. .................... 455/404.1 |
| 7,224,215 | B2 | * | 5/2007  | Osborn ......................... 330/2 |

* cited by examiner

*Primary Examiner* — Lewis G West
*Assistant Examiner* — April G Gonzales
(74) *Attorney, Agent, or Firm* — Schwegman, Lundberg & Woessner, P.A.

(57) ABSTRACT

Some embodiments discussed relate to a method and apparatus, comprising a power amplifier module, a transceiver module coupled to provide a signal to an input of the power amplifier module. The transceiver module comprising an integrated temperature sensor to sense an instantaneous operating temperature of the transceiver and providing a first sensor output signal dependent upon the operating temperature, and an integrated voltage sensor to sense a transceiver supply voltage and generate a second sensor output signal dependent upon the instantaneous transceiver supply voltage, and a processor configured to receive the first and the second sensor output signals, provide a control signal to the power amplifier module to reduce the output power of the power amplifier responsive to the first and the second sensor output signals.

16 Claims, 2 Drawing Sheets

METHOD AND APPARATUS FOR CONTROLLING OUTPUT POWER IN POWER AMPLIFIERS

RELATED APPLICATIONS

This patent application claims the benefit of priority, under 35 U.S.C. Section 119(e), to U.S. Provisional Patent Application Ser. No. 60/863,496, filed on Oct. 30, 2006, which is incorporated herein by reference.

TECHNICAL FIELD

Embodiments described herein relate generally to power amplifiers and more particularly, to control of the output power levels in power amplifiers.

BACKGROUND

Global System for Mobile Communications (GSM) is one of the standards used for mobile phones. Gaussian Minimum Shift Keying (GMSK) is a type of continuous-phase frequency-shift keying used in GSM. Enhanced Data rate for GSM Evolution (EDGE) is a digital mobile technology used in conjunction with GSM to provide packet-switched applications such as internet connection. EDGE additionally uses 8 phase-shift keying (8PSK) as part of the modulation and coding scheme.

Mobile handsets using such technologies include power amplifiers which derive their operating power from a battery.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
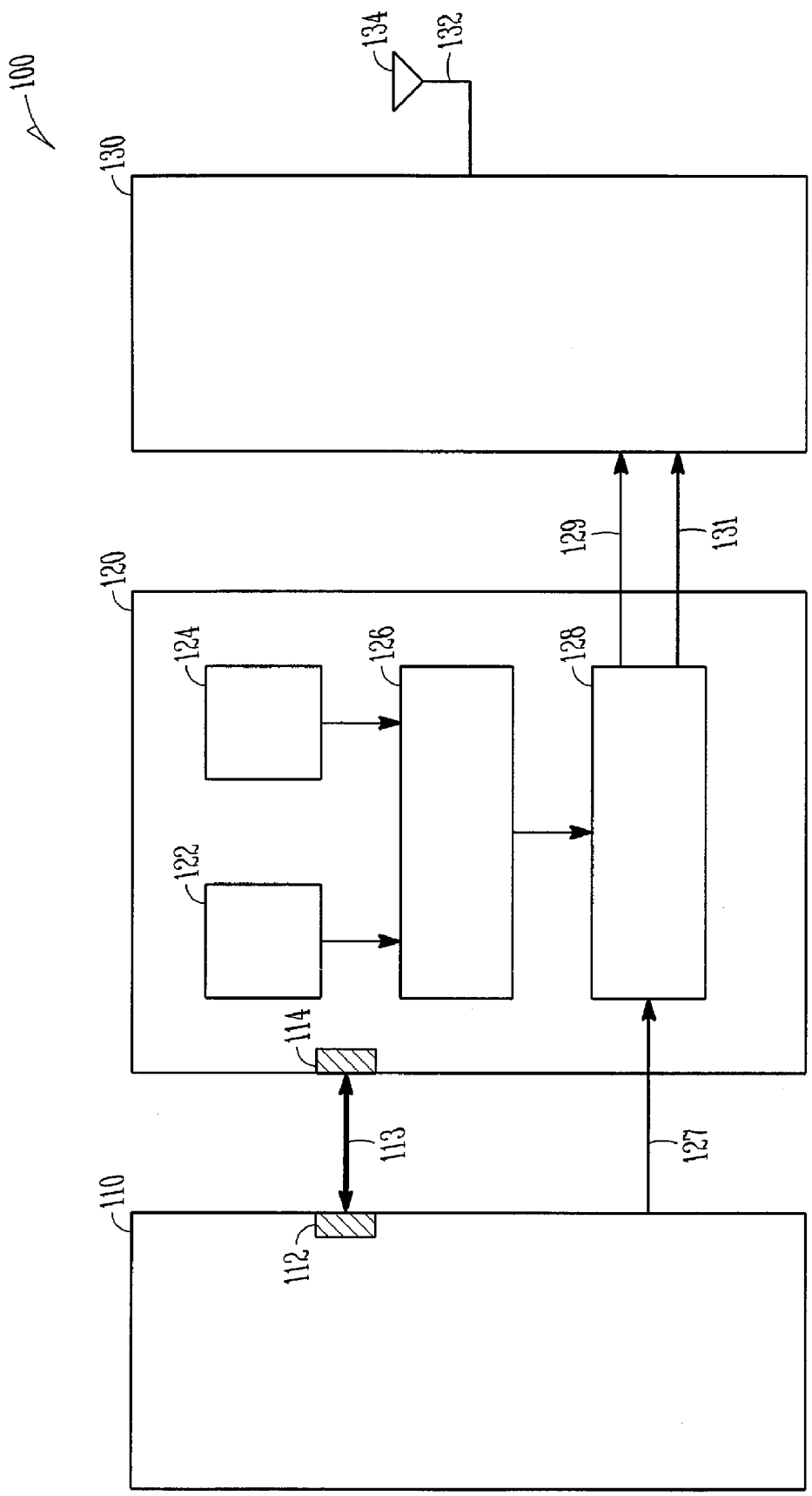
FIG. 1 illustrates a schematic view of a system for controlling output power in power amplifiers, according to some embodiments of the invention.

FIG. 1 illustrates a schematic view of a system 100 for controlling output power in power amplifiers, according to some embodiments of the invention. System 100 includes baseband module 110, RF transceiver 120, and power amplifier 130. Power amplifier 130 is coupled to an antenna 134 via a line 132 carrying the output transmitted power from power amplifier 130. RF transceiver 120 includes a temperature sensor 122, a supply voltage sensor 124, a processing unit 126, a power control unit 128 and a BB-RF interface 114. RF transceiver 120 receives at power controller 128 an input signal provided for transmission to RF transceiver 120 on line 127. Processing unit 126 is coupled to temperature sensor 122, supply voltage sensor 124 and power controller 128.

In operation, a target value for output power of power amplifier 130 is calculated at processing unit 126 based on the signals generated at temperature sensor 122, and supply voltage sensor 124. Power controller 128 receives from processing unit 126, the target value for output power of power amplifier 130. Power controller 128 provides an input signal to power amplifier using line 129 and also provides a bias/$V_{RAMP}$ signal to power amplifier 130 based on the target value calculated at processing unit 126.

Baseband module 110 includes a BB-RF interface 112 which is coupled to BB-RF interface 114 via a communication link 113.

The growth and use of radio-frequency devices (such as hand-held devices) with increasing functional capabilities (e.g., voice, video, and data) has resulted in a greater demand for efficient power-saving techniques to increase the battery life in these devices. Energy-efficient linear power amplifiers are essential components in mobile battery operated systems having wireless connectivity, e.g cellular phones, personal digital assistants (PDAs).

Linearity in power amplifiers is a fundamental requirement for the operation of 8PSK based modulation schemes in mobile handsets. Any amplitude distortion of the signal envelope produces two unacceptable phenomena. Firstly, the spectrum of the signal is widened (also known as spectral re-growth). This widening effect can cause the signal to fail the prescribed modulation mask, a requirement set by the GSM standards to prevent interference to neighboring channels. Secondly, a simple distortion of the modulation constellation results in a lowered signal to noise ratio at the receiver. The GSM standards define an error vector magnitude (EVM) specification, which is a measure of the difference between a transmitted signal and an ideal one. In practice, imperfections in the modulator, other transmitter stages and non-linearity in the power amplifier can consume a significant fraction of the EVM budget.

In embodiments of handsets operating within the EDGE standard, a modified 8PSK modulation scheme is used. As a result of base-band filtering, a final modulation signal is amplitude modulated as well as phase modulated which means a non-constant amplitude envelope is present. Consequently, due to the presence of a non-constant envelope, the spectrum at the output of power amplifier strongly depends on the linearity of the power amplifier used. Hence, it is desired to have power amplifiers used in applications having 8PSK modulation schemes to be optimized in order to meet the stringent linearity requirements.

Mobile handsets using GMSK and/or 8PSK modulation schemes have to cope with changing environmental conditions during their operation. The change in environmental conditions along with change in supply voltage affects the operating characteristics of the power amplifier used in such devices. Operating temperatures can vary within a range of between around −10 C to about 55 C. The supply voltage is between around 3.0V to about 4.3V. The supply voltage is determined by the level of battery discharge characteristic and the voltage drop during the transmit operation. The RF performance of the power amplifier is strongly dependent on the temperature and supply voltage. In general, the higher the operating temperature of the device the lower is the output power, and the lower the supply voltage then the lower is the output power.

In some embodiments, in devices such as those running an 8PSK modulation scheme, even a small change in the output power due to the change in operating temperature and supply voltage can lead to significant degradation in the output spectrum of the transmitted signal. The linear performance of power amplifiers within these devices depend on the temperature and supply voltage within the device. In some instances, maintaining of the same output power while having a low supply voltage along with the device operating at a higher temperature may result in producing a worse spectrum and/or EVM. Therefore, monitoring the operating temperature and the supply voltage is essential in such applications. Controlling the output power according to the instantaneous temperature and/or supply voltage readings enables the generation of signals having a good power spectrum and/or EVM. In some embodiments, in order to meet the requirements of industry standards such as 3rd Generation Partnership Project (3GPP), the output power of the power amplifier has to be reduced within a prescribed limit and this is achieved by monitoring the instantaneous temperature and supply voltage readings and providing a feedback signal to the power amplifier.

In some embodiments, output power is reduced using software functions using algorithms available in the mobile software present in the mobile device. The algorithm evaluates the results of temperature and voltage sensor and, depending on the instantaneous temperature and supply voltage, a target value for the output power is calculated. In some embodiments, this target value for output power is sent to the transceiver in the instance where a controller is located within the transceiver. In some embodiments, the target value is sent to the power amplifier in the instance where the autonomous power control is within the power amplifier. In some embodiments, the use of power reduction algorithms in the mobile software for real-time signal processing of gathered instantaneous temperature and supply voltage data leads to an increase in processing load for the base band processor.

In some embodiments, a RF transceiver based power reduction solution is achieved by using various sensors within the RF transceiver. In some embodiments, an integrated battery voltage sensor is placed along with an integrated temperature sensor in the RF transceiver. The processing of gathered instantaneous temperature and supply voltage is performed within the RF transceiver. As a result of performing the processing within the RF transceiver, use of external software is not required and consequently, the base band processor is relieved of the extra load of processing the parameters gathered by the sensors. In some embodiments, power control module is integrated in the RF transceiver.

In some embodiments, the power control module is integrated in the power amplifier. In some embodiments, based on measurements of parameters such as temperature and/or supply voltage, a processor in the RF transceiver calculates a target value for output power depending on the modulation scheme (e.g., GMSK, 8PSK) that the device is using at a particular time. In some embodiments, set parameters such as voltage threshold, temperature threshold, power reduction slope etc., may be used to achieve a desired change in output power in power amplifier. In some embodiments, these set parameters (e.g., voltage threshold, temperature threshold, and power reduction slope, etc.) are sent to transceiver via a Baseband-RF (BB-RF) interface after the mobile device is powered up. In some embodiments, the various thresholds including the above mentioned thresholds are parameterized. In some embodiments the various thresholds are programmable (or user-settable) and are communicated to the RF transceiver using the BB-RF interface.

Figure 2:
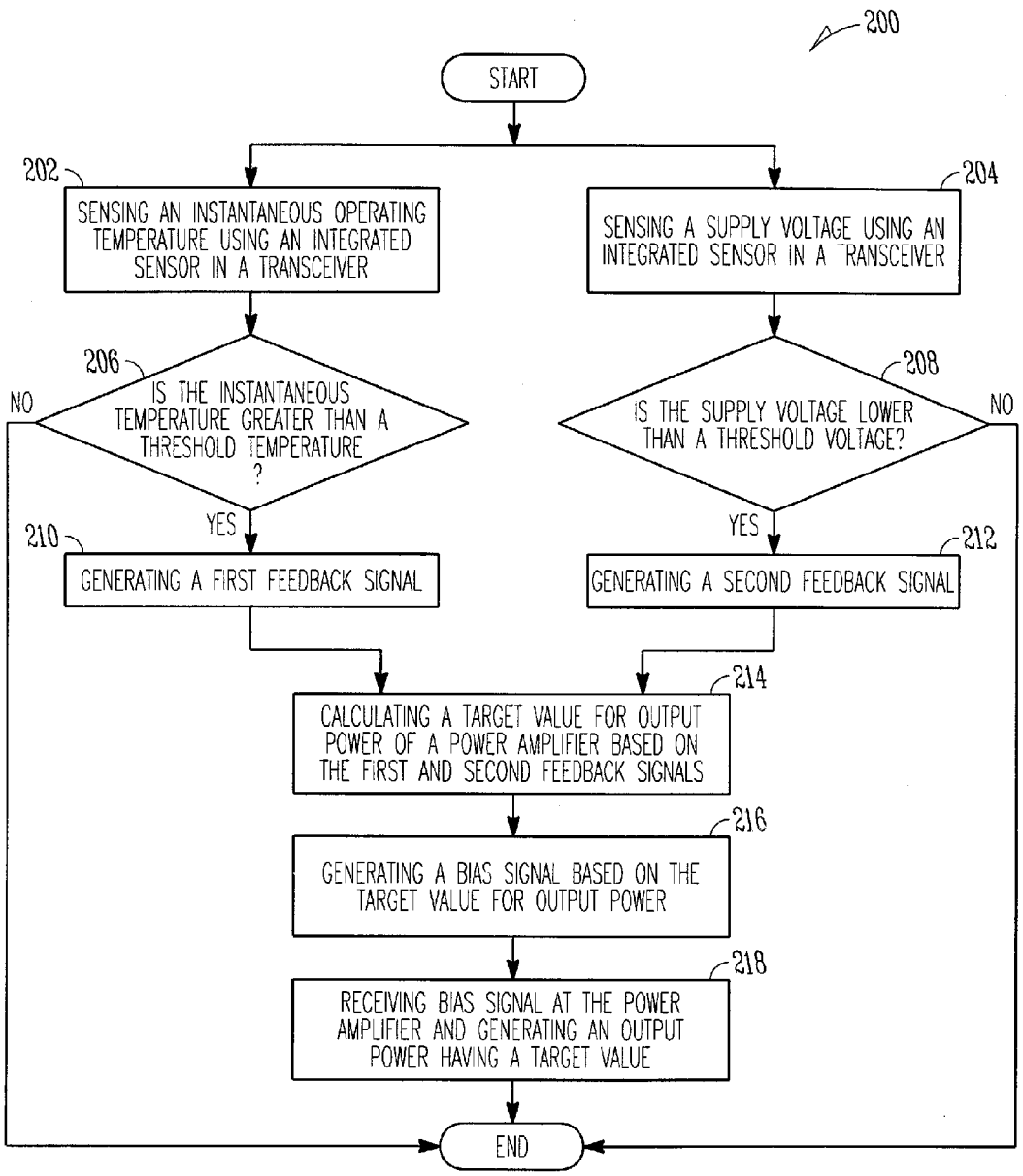
FIG. 2 shows a flow diagram of a method for controlling output power in power amplifiers, according to some embodiments of the invention.

FIG. 2 shows a flow diagram of a method 200 for controlling output power in power amplifiers, according to some embodiments of the invention.

At block 202 of method 200, system 100 performs sensing of an instantaneous operating temperature using integrated temperature sensor 122 in transceiver 120. At block 204, the system 100 performs sensing of a supply voltage using an integrated voltage sensor 124 in transceiver 120.

At block 206, method 200 performs comparing the instantaneous temperature with a threshold temperature and determining if the instantaneous temperature is greater than the threshold temperature. At block 206, if the instantaneous temperature is determined to be greater than the threshold temperature, the method proceeds to block 210. At block 210, the method includes generating a first feedback signal.

At block 208, method 200 includes comparing a supply voltage with a threshold voltage and determining if it is lower than the supply voltage. At block 208, if the supply voltage is determined to be lower than the threshold voltage, the method proceeds to block 212. At block 212, the method includes generating a second feedback signal based on the supply voltage.

At block 214, the method includes calculating a target value for output power of a power amplifier based on the first and second feedback signals. At block 216, the action is generating a bias signal based on the target value for output power. At block 218, the method includes receiving a bias signal at the power amplifier and generating an output power having a target value.

Embodiments of systems for controlling output power disclosed herein are suitable for application in embodiments of handsets operating in various wireless data and voice communications standards and protocols, including GSM, General Packet Radio Service (GPRS), Code Division Multiple Access (CDMA), IEEE 802.11 and others. In addition, embodiments of the system discussed may be used in a wide range of wireless communication devices such as cellular phone, mobile computers, and other handheld wireless digital devices.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including, but not limited to . . . ".

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, comprising:
a power amplifier module; and
a transceiver module coupled to provide a signal to an input of the power amplifier module, the transceiver module including;
an integrated temperature sensor to sense an instantaneous operating temperature of the transceiver and providing a first sensor output signal dependent upon the operating temperature;
an integrated voltage sensor to sense a supply voltage and generate a second sensor output signal dependent upon the instantaneous supply voltage; and
a processor configured to receive the first and second sensor output signals, provide a control signal to the power amplifier module to reduce the output power of the power amplifier responsive to the first and the second sensor output signals, wherein the control signal includes a bias signal based in part on a target value for the output power of the power amplifier module.

2. The apparatus of claim 1, wherein the processor is configured to receive a set of threshold parameters from a baseband module.

3. The apparatus of claim 1, wherein a baseband module is coupled to the processor using a baseband-radio frequency interface.

4. The apparatus of claim 1, wherein the supply voltage is provided by a battery in a cellular phone.

5. The apparatus of claim 2, wherein the set of threshold parameters includes at least one of a voltage threshold, a temperature threshold, and a power reduction slope parameter.

6. The apparatus of claim 2, wherein the set of threshold parameters are user-settable.

7. A system comprising:
a power amplifier configured to receive an input signal and amplify the input signal to generate an output signal; and
a transceiver including;
an integrated temperature sensor to sense an instantaneous operating temperature within the transceiver and provide a first sensor output signal dependent upon that operating temperature,
an integrated voltage sensor to sense a supply voltage and generate a second sensor output signal dependent upon the instant supply voltage, and
a processor configured to receive the first and second sensor output signal and calculate a target value for the power of the output signal of the power amplifier; and
a power control module adapted to receive the target value for the power of the output signal of the power amplifier and to generate a bias signal using the target value for the power of the output signal of the power amplifier, the bias signal coupled to the power amplifier to reduce the power of the output signal of the power amplifier in response to the operating temperature and supply voltage.

8. The system of claim 7, wherein the processor is configured to receive a set of threshold parameters from a baseband module.

9. The system of claim 8, wherein the baseband module is coupled to the processor using a baseband-radio frequency interface.

10. The system of claim 8, wherein the set of threshold parameters includes at least one of a voltage threshold, a temperature threshold, and a power reduction slope parameter.

11. The system of claim 8, wherein the set of threshold parameters are user-settable.

12. The system of claim 7, further comprising an antenna coupled to the power amplifier.

13. The system of claim 7, wherein the supply voltage is provided by a battery in a cellular phone.

14. A method comprising:
sensing an instantaneous operating temperature within a transceiver module and generating a first feedback signal based the difference between an instantaneous operating temperature and a preset temperature threshold;
sensing a supply voltage within the transceiver module and generating a second feedback signal based on the difference between the supply voltage and a preset supply voltage;
calculating a target value for output power of a power amplifier based on the first feedback signal and the second feedback signal;
generating a bias signal in the transceiver module based on the target value for an output power of the power amplifier; and
coupling the bias signal to the power amplifier to reduce the output power of the power amplifier towards the target value.

15. The method of claim 14, wherein sensing the instantaneous operating temperature within the transceiver module includes sensing the instantaneous operating temperature using an integrated temperature sensor situated within the transceiver module.

16. The method of claim 14, wherein sensing the supply voltage within the transceiver module includes sensing the supply voltage using an integrated voltage sensor situated within the transceiver module.

* * * * *